(12) United States Patent
Chen

(10) Patent No.: US 6,675,349 B1
(45) Date of Patent: Jan. 6, 2004

(54) ERROR CORRECTION CODING OF DATA BLOCKS WITH INCLUDED PARITY BITS

(75) Inventor: Chin-Long Chen, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/568,919

(22) Filed: May 11, 2000

(51) Int. Cl.⁷ ............................................. H03M 13/00
(52) U.S. Cl. ..................................... 714/804; 714/758
(58) Field of Search ................................ 714/804, 800, 714/807, 758, 757, 752, 763, 785, 746

(56) References Cited

U.S. PATENT DOCUMENTS

| | | | | |
|---|---|---|---|---|
| 4,345,328 A | | 8/1982 | White ........................... | 371/38 |
| 4,617,664 A | * | 10/1986 | Aichelmann et al. ........ | 714/758 |
| 5,457,702 A | * | 10/1995 | Williams et al. ............. | 714/760 |
| 5,537,427 A | | 7/1996 | Chen ............................ | 371/37 |
| 5,745,507 A | * | 4/1998 | Chen ............................ | 714/763 |
| 5,751,744 A | * | 5/1998 | Babb ............................ | 714/800 |
| 5,754,562 A | * | 5/1998 | Chen ............................ | 714/752 |

* cited by examiner

Primary Examiner—Christine T. Tu
(74) Attorney, Agent, or Firm—Lawrence D. Cutter

(57) ABSTRACT

Advantage is taken of the presence of ordinary parity check bits occurring in the data flow in a computer or other information-handling system to improve error correction capability while at the same time providing simpler decoding. More particularly, the encoding and decoding system, methods, and devices herein include the capability of separating error correction in data bits and in parity check bits. In this regard, it is noted that the present invention therefore provides an improved memory system in which the parity check bits do not have to be stripped off prior to storage of data into a memory system with error correction coding redundancy built in. Instead of these parity check bits being stripped off, they are incorporated into a generalized and generalizable error correction system which produces a significantly simple decoding and error correction structure. The system provides for SEC-DED code capabilities while at the same time providing capabilities for correcting multiple odd numbers of errors occurring in distinct groups. Accordingly, the present invention provides encoding and decoding systems and methods, and a correspondingly improved memory system.

30 Claims, 4 Drawing Sheets

ERROR CORRECTION CODING OF DATA BLOCKS WITH INCLUDED PARITY BITS

BACKGROUND OF THE INVENTION

The present invention is generally directed to error correction coding and decoding systems. More particularly, the present invention is directed to the incorporation of error correction coding in systems which include parity bits associated with blocks of binary data. Even more particularly, the present invention is directed to a generalized method for constructing error correction codes, encoders, and decoders in a fashion which adds a minimum number of error checking bits while still preserving the code property of correcting single errors and detecting double errors.

Parity bits are commonly used for checking data transfers in computer systems. This parity may be either odd parity or even parity. For purposes of the present invention, there are no restrictions on the form of parity employed. When used in conjunction with memory systems in computers, parity bits employed in the rest of the computer system are often stripped off and entirely replaced by error-checking bits. For purposes of understanding the present invention, it should be appreciated that, while parity bits do provide a form of error correction capability, the term "check bits" (or ECC bits herein) is not meant to include parity bits per se in the present discussion. In particular, it is noted that the present invention seeks to encode a number of check bits in addition to the usual parity bits associated with data transfers within a computer system.

However, to provide error correction for data which is stored in a random access memory, the parity bits are usually stripped off and replaced by check bits in a store operation. The check bits that are added are based only upon the data present and the encoding operation of adding redundant bits does not take any advantage of the parity bits which might already be present. In a sense then, the present invention seeks to combine the best features associated with a specific form of error checking, namely, the use of parity bits, in conjunction with more generic forms of redundant bit addition, namely, generic error correction capabilities. The present invention seeks to do this while still maintaining the single error correction and double error detection (SEC-DED) capabilities for the encoding while at the same time using the minimal number of added check bits.

When the parity bits are stripped off during a store operation, the parity to ECC (error correction code) and the ECC-to-parity conversion are often not done, primarily for speed consideration. In these cases, the ECC bits are generated on top of the parity bits. However, since parity bits can be used as part of an overall ECC checking system, the additional redundant bits required for ECC can be reduced from the number required when no parity bits are available.

In particular, one of the purposes of the present invention is to provide a generic method for constructing encoding systems, decoding systems, and memory systems for various sizes of data path widths and memory organizations. Even more particularly, the present invention provides a mechanism in which parity bits and check bits resulting from a read operation may be corrected independently from one another. Furthermore, in doing so, it is applicant's intention to provide simpler and faster circuits for performing these operations.

Of particular relevance in this area, U.S. Pat. No. 4,345,328 issued to Gary White on Aug. 17, 1982, describes an encoding scheme which uses five ECC check bits to correct single errors and to detect double errors for a group of 36 data bits with four parity bits in each subgroup of nine data bits. However, the teachings of White are lacking in a description of any kind of general method for generating ECC check bits when pre-existing parity bits exist. Furthermore, the coding method described in the patent to White does not detect multiple odd numbers of errors. Lastly, but most importantly, the decoding of bit error positions in the patent to White is based upon the entire data group and correspondingly is much more complex in its implementation. In contrast, the encoding and decoding methods of the present invention provide a mechanism in which errors can be indicated as occurring in a specific one of the parity bits or in a specific non-parity bit (that is, in a data bit) or even, if desired, in one of the ECC bits.

SUMMARY OF THE INVENTION

In accordance with a preferred embodiment of the present invention, a method for encoding binary data arranged in t blocks of m+1 bits each, with each block including a parity check bit, mt bits are encoded using a binary parity check matrix H which adds r check bits in addition to the t parity bits already present so as to permit decoding of the resultant mt+t+r bits so that determination of bit error positions is performable on individual blocks of m+1 bits as a result of the structure of the parity check matrix which maintains a separation of check bits and already existing parity bits.

The present invention also includes an electrical circuit for encoding input from electrical signals representing binary data arranged in t blocks m+1 bits each with each block also including at least one parity bit, through the utilization of a parity check matrix H of the form (M M . . . M I) where M is an r by m matrix and I is an r by r identity matrix. In such a system, the circuit adds a total of r check bits which is in addition to the already existing t parity bits in each block.

In yet another embodiment of the present invention, an apparatus for error correction for binary data arranged in t blocks of m+1 bits with an additional r check bits comprises a parity check for each of the t blocks and a syndrome generator which is constructed in accordance with the parity check matrix used to encode the binary data. Furthermore, the decoding apparatus of the present invention includes a first circuit means for determining that a single error has occurred in the parity bits based upon an "all-zero" output from the syndrome generator and an indication from the parity checkers for the presence of one and only one parity error in the t blocks of data. The apparatus for error correction also includes a second circuit means for determining that a single non-parity error has occurred in one of the t blocks based upon a non-zero output from the syndrome generator and an indication from the parity checker for the presence of one and only one parity error in the t blocks of data.

In yet another embodiment of the present invention, a memory system comprises an array of addressable storage locations for binary data wherein the locations are capable of storing t blocks of data with m+1 bits in each block plus an additional r check bits. A digital encoding circuit appends r check bits to the (m+1)t bits of data prior to storage in one of these storage locations. Each block includes at least one parity bit. Additionally, a digital decoding circuit receives mt+t+r bits of data from storage locations and the decoding circuit is configured so as to be capable of independently indicating whether a single error has occurred in a specific one of the parity bits or in a specific non-parity bit.

Furthermore, these error indications do not rely on an analysis of the entire data group. This indication is made possible as a result of the specific digital encoding for the r check bits which is implemented by the encoding circuit which is based on the parity check matrix described herein.

Accordingly, it is an object of the present invention to add ECC check bits to a block of data which already includes parity check bits associated with individual subgroups of the block of data.

It is also an object of the present invention to add ECC check bits to data which already includes parity bits in a cooperative and consistent manner.

It is a still further object of the present invention to generalize the construction of encoding and decoding circuits for check bit encoding and error detection and correction, particularly in computer memory systems.

It is a still further object of the present invention to add the minimum number of check bits needed to preserve SEC-DED code capabilities.

It is yet another object of the present invention to simplify the construction of ECC decoder circuitry.

It is also an object of the present invention to establish a cooperative relationship between parity check bits and more generically applicable ECC check bits.

It is a still further object of the present invention to provide a decoding system and method in which the decoding of bit error positions is not based upon the entire data group.

It is also an object of the present invention to provide a decoding system, method, and algorithm which is modular in structure and which provides substantially the same logic circuit construction for each subgroup.

It is a still further object of the present invention to provide an error encoding and decoding system and method in which multiple odd errors are detected.

It is yet another object of the present invention to provide a memory system in which there is a cooperative relationship between parity bits present in incoming data and ECC check bits present in the structure of the memory system.

Lastly, but not limited hereto, it is an object of the present invention to extend the error correction capabilities associated with memory systems and, in particular, those memory systems which preserve SEC-DED error correction capabilities.

DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1:
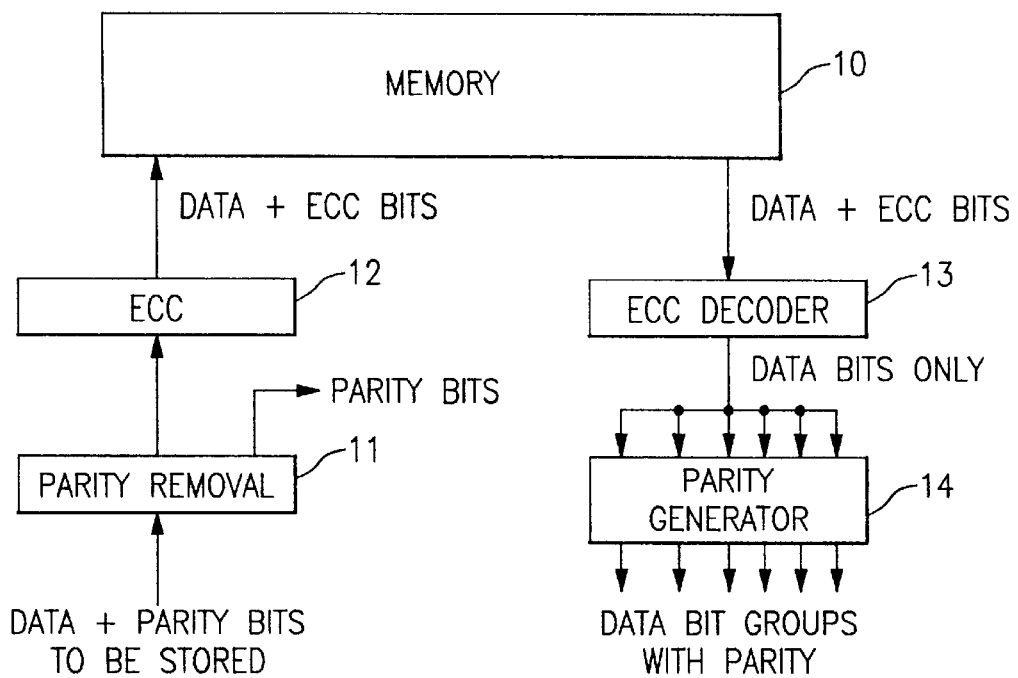
FIG. 1 is a functional block diagram illustrating one of the problems associated with a system which does not take advantage of parity bits but in which the memory system also incorporates error correction coding.

FIG. 1 illustrates a memory system which does not take advantage of the presence of parity bits. In particular, in such a system, when data plus parity bits to be stored are presented to memory system 10, parity bits are removed as suggested by functional block 11 (parity removal). The data bits with the parity bits stripped off are presented to an error correction coding circuit (ECC circuit) 12. Typically, the information presented to block 11 is in the form of subgroups of data with each data group including a parity check bit. For example, for purposes of the discussions herein, it is useful to consider the data bits presented to parity removal block 11 as comprising t subgroups of data with m bits in each group. Associated with each group of m bits, there is at least one parity check bit computed to ensure that the subgroup possesses either even or odd parity in accordance with well-known principles. These parity bits are present in the data as it is transferred from location to location in an information handling system whether it be from one portion of a chip to another portion of the same chip or in a transfer in a network environment where the information comes from a geographically distant location.

As indicated above, ECC circuit 12 is often not provided with parity bits, but rather, operates on its own to encode the data bits independently. In particular, in the typical situation here there is no parity bit, there would be mt data bits presented to ECC circuit 12. This circuit adds a number of check bits to the data presented to it and stores this data in memory 10. The number of bits added is a function of design needs for memory system reliability with Single Error Correction/Double Error Detection (SEC-DED) typically being an acceptable standard.

For purposes of the present invention, memory comprises any form of digital storage system which retains bits of information in addressable storage locations. The duration of the retention might be permanent or temporary and could even include cache systems in which storage is indeed relatively temporary and even very transient in duration.

In memory systems such as shown in FIG. 1, data plus check bits are returned from the various memory locations and are provided to ECC decoder circuit 13 which operates to correct. errors and to provide an indication that the number of errors exceeds a certain amount. Typically, memory systems are designed to incorporate SEC-DED coding capabilities. Thus, the output from ECC decoder 13 only includes data bits which have been corrected as necessary. Perhaps ironically at this point, parity generator 14 typically re-adds new parity bits to the data bits from decoder 13 to replace previously discarded parity bits. In particular, FIG. 1 illustrates that it is often the case that the data bits occur in subgroups or blocks of m bits each, and it is also the case that parity generator 14 typically adds one parity check bit per each of the t blocks or subgroups of data bits. The addition of parity bits by means of parity generator 14 is ironic in the sense that these bits are in fact removed in many memory systems by means of parity removal block 11 and now have to be replaced.

Figure 2:
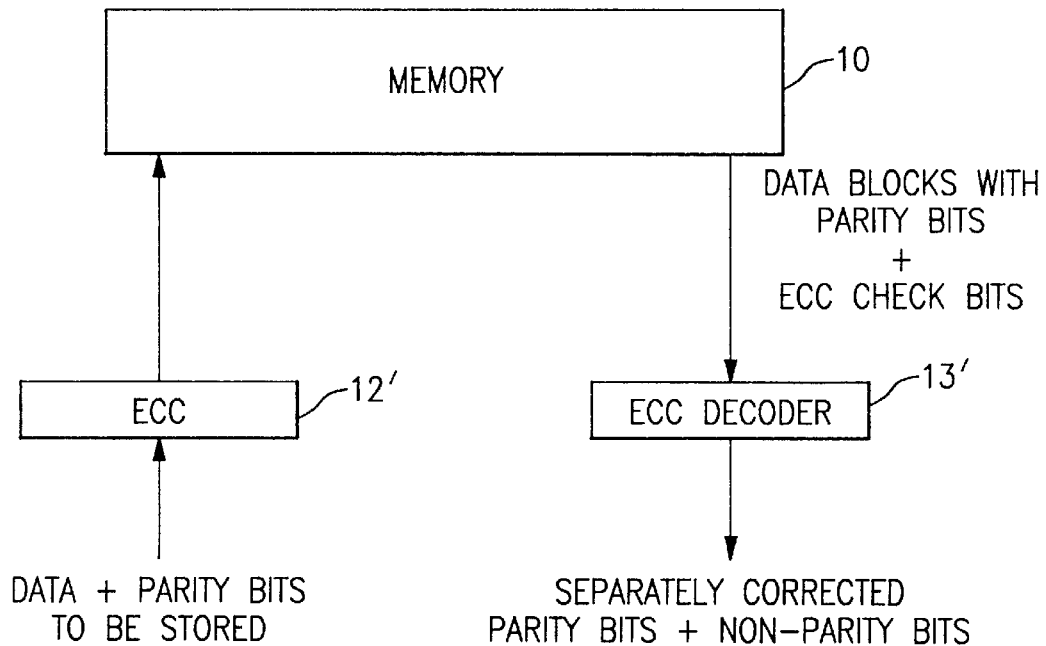
FIG. 2 is a functional block diagram illustrating the structure of a memory system in accordance with the present invention.

In accordance with the present invention, a memory system is constructed using the memory architecture shown in FIG. 2. In particular, ECC circuit 12' uses both data bits and the formerly discarded parity bits in the calculation of an additional set of r check bits. And as above, it is assumed that the data bits are arranged in t blocks or subgroups of m bits each. The resultant output from ECC circuit 12' is provided as a data input to memory 10. On retrieval from storage locations within memory 10, the data blocks, now with both parity bits and the ECC check bits, are provided to ECC decoder 13' which, in accordance with the present invention, can separately determine and detect the presence of errors in a parity bit or errors in individual data bits or, in fact, if so desired, errors in the check bits themselves in accordance with at least SEC-DED coding capabilities.

Figure 3:
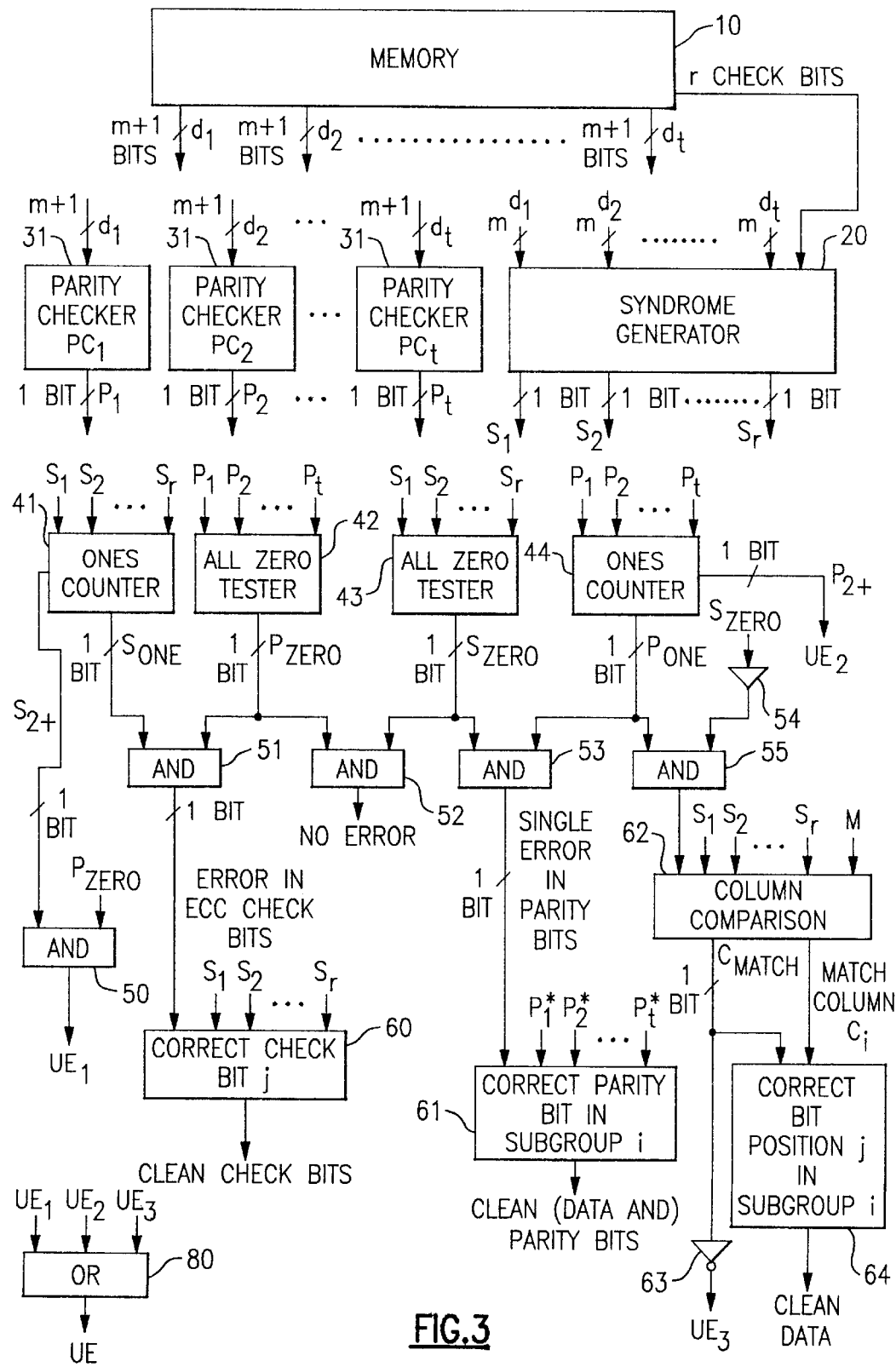
FIG. 3 is a functional block diagram illustrating a circuit for performing error correction and detection for the SEC-DED coding system described in the present invention.

Because of the specific structure provided herein for ECC encoding circuit 12', ECC decoder circuit 13' is greatly simplified. The simplified structure for decoder 13' is illustrated in FIG. 3 which is described more particularly below. However, at the present point, it is useful to consider the nature of the parity check matrix H which is used to encode the data and the parity bits. In this regard, it is to be particularly noted that, in the error correction coding arts, the specification of a parity check matrix is tantamount to a physical circuit description. Each row in the parity check matrix corresponds to an Exclusive-OR logic (XOR) function. In this regard, it is to be noted that the Exclusive-OR logic function also performs the function of module two addition which is relevant for considering error correction capabilities in the context of abstract linear algebra which is needed for understanding code construction and capabilities. However, suffice it to say for the present purposes, the specification of a parity check matrix directly defines an electrical circuit capable of producing check bits which satisfy the linear constraint conditions of a parity check matrix.

In the present invention, data bits are considered to be grouped in t subgroups of m bits each. (Note though that even this restriction can be lifted as more particularly discussed below. However, for an initial understanding, subgroup size equality is assumed.) The data group therefore has a total of mt bits. Associated with each of the subgroups of m bits, there is a parity bit. Thus, there are a total of at least t parity bits. To construct a single error-correcting and double error-detecting (SEC-DED) code for this data, a parity check matrix H of the form (M M . . . M I) is used, where M is an r by m binary matrix, I is the identity matrix with r rows and r columns, and r is the number of ECC check bits added to the data group of mt bits. Note that there are t copies of M contained in the parity check matrix H. This corresponds to the t data subgroups in the parity check matrix. The r check bits together with the t parity bits are sufficient to provide SEC-DED capability and more.

Given this structure, there are two distinct paths for construction of the submatrix M. In particular, if M is an odd weight matrix, it is constructed in a certain way and if it is an even weight matrix, its construction is slightly different. A matrix is of odd weight if it contains an odd number of "one" entries in every column. Likewise, a matrix M is of even weight if it has in every column an even number of "ones."

In particular, if M is of odd weight, the matrix M is constructed by selecting distinct binary vectors containing an odd number of ones, except those binary vectors having single ones as the columns of the matrix M. Note though that vectors having columns with only a single one are, of course, used in the r×r identity matrix I. Since there are $2^{r-1}-r$ distinct vectors available, the construction is limited to $m \leq 2^{r-1}-r$. The minimum number of ECC check bits r required therefore has to satisfy this inequality. However, it is noted that by choosing r to be the smallest integer satisfying this inequality, it is possible therefore to provide efficient code structures which still satisfy the desire for SEC-DED code capability.

In the particular case that M is an even weight matrix, the columns of this matrix are selected to be distinct non-zero binary vectors containing an even number of ones. In this particular case, the size of the data subgroup m is limited by the inequality of $m \leq 2^{r-1}-1$. This condition, as above, also determines the minimum required number of ECC check bits for SEC-DED encoding and decoding. And again, in preferred embodiments of the present invention, r is selected to be the smallest integer satisfying this inequality.

For a given subgroup size m, the minimum number of ECC check bits, as required from the above two constructions (odd weight and even weight), has to satisfy $2^{r-1} \leq m+1$. Accordingly, the choice between odd weight and even weight matrices M is determinable by the minimum number required of the ECC check bits and by other considerations such as the number of Exclusive-OR gates which, in turn, is determined by the parity check matrix H which is determined by matrix M. In general, the smaller the number of "ones" in a parity check matrix, the fewer number of Exclusive-OR gates required.

The encoding system, method, and circuit described above provide significantly simpler mechanisms for decoding. In particular, in accordance with the present invention, if ECC circuit 12' encodes data using the system described above, then it is possible to construct ECC decoder 13' in a much simpler manner.

In order to best understand the operation of the circuits shown in FIG. 3 and in the other figures contained herein, it is perhaps best to first understand the algorithm that is employed for ECC decoding when the original data encoding occurs as described by the parity check matrix H above.

The first step in error detection, when data is fetched from storage, is to check parity in all of the data subgroups and also to generate the ECC syndrome. For purposes of the discussion below, the vector $P=(P_1, P_2, \ldots, P_t)$ represent the output of the individual parity check circuits for the t data subgroups. Also, the vector $S=(S_1, S_2, \ldots, S_r)$ is the ECC syndrome. In accordance with well-understood principles of error correction coding, the syndrome is (mathematically) the product of the entire output data vector from memory 10 and the transposed check matrix H. As with the construction of encoding circuits from the parity check matrix, those of ordinary skill in the art clearly understand the construction of syndrome generator circuits given a parity check matrix. The inner product of the data vector with the corresponding individual columns of $H^T$ (the transpose of the parity check matrix H) represents a single bit. As is well understood, this bit is computed as a modulo 2 summation (Exclusive-OR gate function) where the inputs to this summation are the outputs from AND gates whose inputs are bits from the data vector and corresponding bits from the columns of $H^T$. The syndrome comprises therefore r data bits, one bit for each column in $H^T$.

The decoding of the output from memory 10 occurs as follows: if both P and S are all zero, there is no error. If P is all zeros and S has a single one, there is an error in the ECC check bits. The error position corresponds to the position of one of the "ones" in S. In particular, if $S_j=1$, then check bit j is in error. If P is all zeros and S has two or more ones, there are uncorrectable errors. If P has a single one and S is all zeros, there is an error in the parity bits of the data group. The position of "one" in P determines the error position. In particular, if $P_j=1$, then the parity bit of subgroup j is in error. If P has a single one at position i and S is not all zeros, then S is compared with the columns of the ECC submatrix M. If S identical to column j of M, then bit position j of subgroup i is in error. If S is not one of the columns of M, then there are uncorrectable errors. And finally, if P has two or more ones, there are uncorrectable errors. For purposes of implementing the above correction method, data bit j in subgroup i is set by the condition that $P_i=1$ and S is identical to column j of M. The uncorrectable error signal is set when one of the following three conditions is met:

1. P is all zeros and S had two or more ones;
2. P has two or more ones; and
3. P has one "1" and S is not a column found within matrix M.

The implementation of the decoding algorithm is easily modularized and provides the same logic for a subgroup which is repeated t times for the entire data group. In contrast, in the above-mentioned patent to White, the decoding is not broken down into subgroups and, thus, is more complex. In addition, the uncorrectable error detection in White's patent is generated by the condition that the combined vector (P,S) has an even number of ones and is not all zeros. This method does not detect any of the odd number of errors. On the other hand, many of the odd number of errors are detected using the method described herein. In particular, the second uncorrectable error condition, indicated above, ensures that all odd number of errors are detected as long as they appear in two or more distinct subgroups.

Specific attention is now directed to the decoding circuit shown in FIG. 3. In particular, for decoding, memory 10 supplies, as a result of a fetch operation, output data bits $d_1$, $d_2$, ..., $d_t$, in groups of m+1 bits to syndrome generator 20 and also to individual parity checkers 31. In particular, for the m+1 bits in subgroup i, the m data bits d are provided to parity checker $PC_i$ to produce a one bit output $P_i(1 \leq i \leq t)$. Parity checker $PC_i$ 31 produces a single output bit which is one only if a parity error occurs within the $i^{th}$ subgroup of m bits. Parity may be even or odd, but should be consistent across the subgroups.

Syndrome generator 20 is based upon the parity check matrix H which is described above. Furthermore, the construction of a syndrome generator, in terms its corresponding circuit gates, is not only well known, it is also described above. Essentially, syndrome generator 20 computes the product of the memory output vector $(d_1, d_2, ..., d_t)$ with the transpose of parity matrix H. However, the parity bits in the t data groups are not used in generating the syndrome. Thus, at the first stage of the decoding circuitry in FIG. 3, the resultant output is two vectors, vector $P=(P_1, P_2, ..., P_t)$ and the syndrome vector $S=(S_1, S_2, ..., S_r)$ where r is the number of check bits that have been added in accordance with the encoding mechanism provided by the specific parity check matrix H described herein.

The parity checker outputs $P_1$ are supplied to circuit 42 which tests to determine whether or not all of the parity check bits are correct. Logic circuit 42 produces output $P_{zero}$ which is 1 if all of its input bits $P_i(1 \leq i \leq t)$ indicate correct parity. Likewise, the r output signal bits from syndrome generator 20 are supplied to all zero tester circuit 43 which produces an output $S_{zero}$ which is 1 only on the condition that the syndrome S comprises an all zero vector.

The syndrome S is also supplied to ones counter circuit 41 which preferably produces two output signals. An output signal $S_{one}$ is a logical "1" only upon the condition that there is only one bit turned on in the syndrome. If the syndrome has two or more bits turned on, the output signal line $S_{2+}$ is turned on. Likewise, similar ones counter circuit 44 is employed and receives as its input the t output bits from parity checkers $PC_i$ (reference numeral 31). It is noted that the input to all-zeros-tester 42 and ones counter 44 are the output signal bits from parity checker blocks 31 and are not the individual parity bits themselves. Such parity bits are instead denoted as $P_i$ to distinguish them (see the discussion below with respect to the inputs to functional block 61) As with ones counter 41, ones counter 44 also produces two output signals. It produces an output signal $P_{one}$ which is a logical "1" only if there is only one parity checker which indicates a parity error. On the other hand, if there is more than one parity error found, then signal line $P_{2+}$ is also set to the logical "1" state. In point of fact, if $P_{2+}$ is a logical "1," this is an indication of an uncorrectable error (of type $UE_2$). Likewise, if signal line $S_{2+}$ is a 1 and $P_{zero}$ is also a logical "1," this is also an indication of an uncorrectable error (of type $UE_1$). In particular, the $UE_1$, signal is generated from the output of AND gate 50 as shown in FIG. 3.

If there is one "1" bit "on" in the syndrome S and $P_{zero}$ is also 1, then AND gate 51 is used to provide an indicator that there is an error in the ECC check bits themselves. Furthermore, in this case, the syndrome vector provides an indication of the check bit j that is in error. Accordingly, functional block 60 is used to correct the syndrome bit in error. However, it is noted that functional block 60 is optional since there is generally no essential need in the system shown in FIG. 2 to perpetuate the transfer of check bits throughout the computer or information system in question.

If the syndrome S and the parity vectors P are both all zero, this provides an indication of no error occurring anywhere. This signal indication is provided as needed by means of AND gate 52 as shown.

If syndrome S is all zeros and there is only one parity check bit output which is "1" ($S_{zero}=1$ and $P_{one}=1$) then the output of AND gate 53 provides an indication that there is a single error in the parity bits. In this case, the variable $P_i$ indicates that the parity bit itself in subgroup i is in error. Accordingly, this error is corrected in functional block 61 which is described in more detail in FIG. 4.

Lastly, if the syndrome is not zero ($S_{zero}=0$) as provided by passing the $S_{zero}$ signal through inverter 54 and there is only one parity checker $P_i$ indicating an error ($P_{one}=1$), then the situation is corrected as follows. In this case, a match between the syndrome vector and the columns of M is generated in functional block 62. These operations are detailed below in the discussion for FIGS. 5, 6, and 7. Functional block 62 produces output signal $C_{match}$ indicating that there is in fact a match between the syndrome vectors and one of the columns in M. An uncorrectable error condition of type 3 $UE_3$ is indicated by the output signal from inverter 63. Likewise, the indication of a column match is used as an input to corrector circuit 64 which corrects bit position j in block i ($1 \leq j \leq r$, $1 \leq i \leq t$). The details for one of the modules 64.i that make up corrector 64 is more particularly shown and discussed below in reference to FIG. 7.

Figure 4:
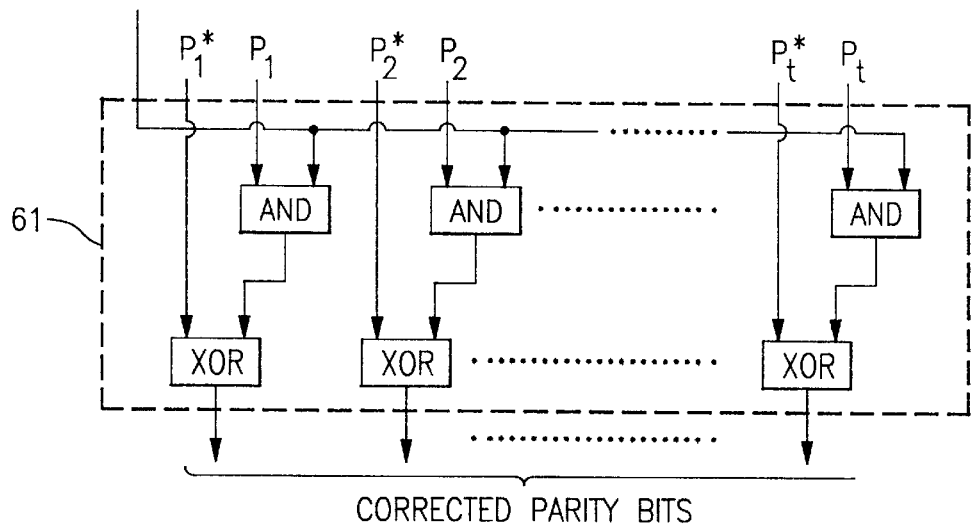
FIG. 4 is a functional block diagram illustrating the correction of parity bit errors.

FIG. 4 illustrates circuit 61 for correcting a parity bit error in subgroup i. In particular, the Exclusive-OR gates operate as conditional inverters which are in turn conditioned upon the output of the AND gates as shown. The output of these AND gates is likewise gated upon the signal from block 53 indicating that there is a single error present and that the error has occurred in the one of the parity check bits. In this case, correction is made simply by inverting the corresponding parity bit $P_i$.

Figure 5:
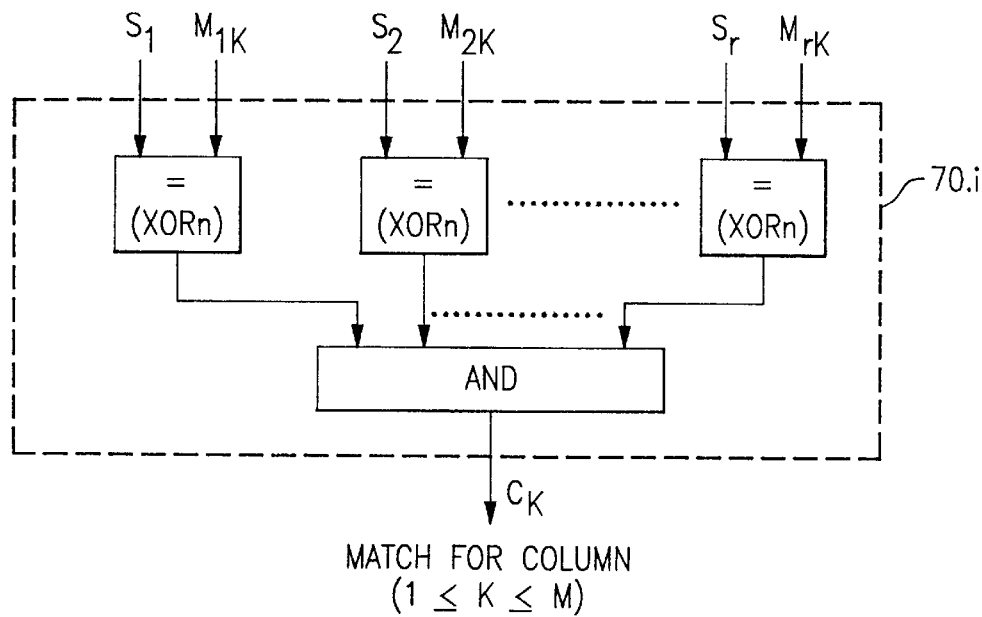
FIG. 5 is a functional block diagram of a circuit which performs column matching between a resultant syndrome and a column of a given matrix M.
Figure 6:
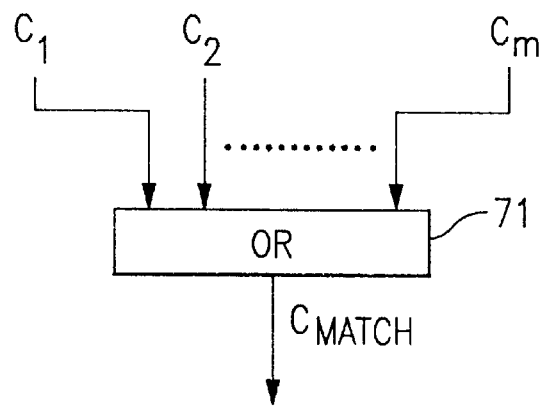
FIG. 6 is a diagram illustrating the logic behind the construction of a signal indicating a column match.

As indicated above, column comparison block 62 seeks to provide an indication for a specific block in the matrix M which matches syndrome vector S. Accordingly, as shown in FIG. 5, output signal $C_k$ is set equal to a logical "1" when each of the syndrome vector components $S_j$ exactly matches one of the columns of the matrix M. In particular, it is noted that the $k^{th}$ column of M is indicated by the vector $(m_{1k}, m_{2k}, \ldots, m_{rk})$. When all of the components of S match the corresponding $k^{th}$ column of M, an output signal $C_k$ is produced. A column match indication is provided by means of OR gate 71, as shown in FIG. 6, to produce signal $C_{match}$ when any one of the possibly m columns match. However, it is noted that, in proper operation of the present invention, there will be a match for only one column.

While FIG. 5 represents the column matching aspects of the present invention in a more readily appreciated form, preferred embodiments of the present invention implement this function by means of AND gates having r inputs which are supplied with either the true or complemented form of the syndrome variables. For example, if the syndrome is to be checked for matching against a column pattern such as (1011), then the true form of syndrome bits 1, 3, and 4 would be supplied to the AND gate along with the complement form of syndrome bit number 2.

Figure 7:
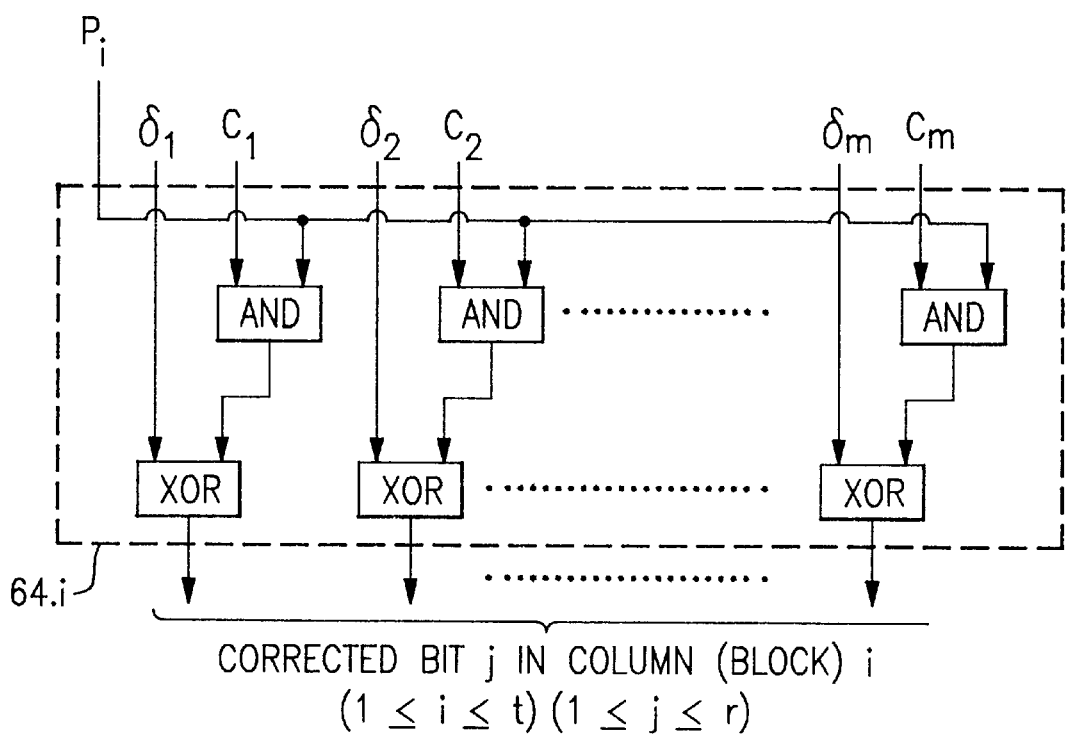
FIG. 7 is a functional block diagram illustrating the correction of bit position i in block j of the data group which possesses a total of mt bits.

The actual correction of bits in this particular case (P has a single one; S is not all zeros; and there is a column match) is carried out by means of corrector circuit 64. A modular portion of corrector 64 is shown in FIG. 7 as functional block 64.i. In particular, there are t circuits in corrector 64 substantially identical except for inputs in overall corrector circuit 64. In short, FIG. 7 illustrates only one of these portions. The other portions are similar. Also of note in FIG. 7, it is seen that the symbol $\delta_k$ is employed to indicate a specific bit from one of the data subgroups. (This is to avoid confusion with the symbol $d_i$ which is really a set of m bits.) In different subgroups, different sets of m bits are provided to corrector 64.i. Functional block 64.i includes conditional inverters (Exclusive-OR gates) as shown. If there has been an error in the $i^{th}$ block as indicated by $P_i=1$ and an error has occurred in position j corresponding to $C_j=1$, then the $j^{th}$ position in subgroup i is inverted in accordance with the outputs from the AND gates shown.

The description above provides a general system for incorporating SEC-DED coding capabilities when data is grouped into blocks with each block including a parity bit. Attention is now focused upon a particular solution in which a memory structure in which the data arrives in eight subgroups with 36 bits in each subgroup. Furthermore, each subgroup includes one parity bit and, accordingly, each subgroup is seen to contain 35 data bits and one parity bit. Thus, a total of 280 data bits and 8 parity bits are employed as a memory input. In this structure in accordance with the notation employed above, m=35 and t=8. To implement a single error-correcting and double error-detecting code for 288 bits ten ECC bits would normally be required. However, in accordance with the present invention wherein utilization of the parity bits is employed, an SEC-DED code is designed using only seven ECC check bits instead of ten. This represents a 30% saving in the number of check bits required. From the general construction methods presented above, the minimum number of ECC check bits r is seven because r=7 is the minimum number that satisfies $2^{r-1} - 1 \leq 35$. The subgroup parity bits allow fast checking of the data. If a parity check is invalid, the EEC logic takes over for single bit error correction or multiple bit error detection.

The EEC parity check matrix for generating the seven ECC check bits for this example is structured and expressed in the form H=(M M M M M M M M I), where I is the 7 by 7 identity matrix and each of the eight matrices M represents a 7 by 35 binary matrix. Matrix M is constructed as either as an odd weight matrix or as an even weight matrix. However, an even weight matrix has a smaller number of ones in the matrix which results in using a fewer number of circuits in the implementation. To construct a matrix M with a minimum number of ones, one first selects all 21 7-bit vectors of weight 2 (vectors containing two ones). Next, one selects 14 7-bit vectors of weight 4 to make up a total of 35 columns for the M matrix. The following M matrix is an even weight matrix and has a minimum number of ones. This matrix is specified as follows:

```
111111 111111 000000000 000000 000000 11
100000 011100 100100100 011000 011011 10
010000 101010 010010010 101000 101101 10
001000 110001 001001001 110000 110110 10
000100 100011 100001010 000011 011110 01
000010 010101 010100001 000101 101011 01
000001 001110 001010100 000110 110101 01
```

Each row of a parity check matrix represents an equation for the calculation of an ECC bit. For example, the first row has a "1" in positions 1–12 and 34–35. The first check bit then is the Exclusive-OR (XOR) or the negative Exclusive-OR (XORN or equivalence or equality) of the data bits 1–12 and 34–35 of all eight data subgroups. The other check bits are generated similarly from the data bit specifications found in the bit positions of rows 2–7 in the matrix. The calculation of ECC check bits does not involve parity bits of the data subgroups. That is, the ECC check bits are generated independently of the data subgroup parity bits. Furthermore, the decoding algorithm described above is fully applicable to the specific code given. Additionally, to simplify uncorrectable error signal generation, unconditional error $UE_3$ may be replaced by a system in which an error is generated if the vector P has one "1" and S has an odd number of ones. This simplification of uncorrectable error generation is at the expense of reducing multiple error detection. In particular, the detection of triple errors is reduced from 82% to 69%. Nonetheless, this might be an acceptable trade-off in certain circumstances.

It is also noted that the discussion above has assumed that each block of data includes the same number of bits m. However, in general, this is an unnecessary limitation. In order to construct codes in accordance with the present invention when this restraint is not present, it is merely sufficient to start with a value of m which is large enough to accommodate the largest sized subgroup. The matrices M are then constructed using the numbers of rows sufficient for the bits in the particular subgroup. The rest of the array columns would be zeros or just considered not to be present at all. If this encoding structure is employed, the decoding circuit shown in FIG. 3 is just as applicable. Nonetheless, circuit simplifications still present themselves as a result of the effectively zero entries in the various columns of the M matrix.

Accordingly, from the above, it is seen that the present invention provides a system and method for encoding and decoding of binary data particularly in the context of memory storage systems. In particular, it is seen that the present invention takes advantage of the presence of parity check bits to construct both encoding and decoding structures which are simple, efficient, and fast. Even more particularly, the present invention provides a mechanism for preserving single error correction and double error detection code capabilities while at the same time employing a minimum number of check bits which need to be generated and stored.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for encoding binary data arranged in t blocks of m+1 bits with each block including a parity check bit, said method comprising the step of:

encoding said mt bits using a binary parity check matrix H which adds r check bits in addition to said t parity check bits so as to permit decoding of said mt+t+r bits so that determination of bit error positions is performable on said individual blocks of m+1 bits due to maintenance of separation of parity and check bits via the parity check matrix H.

2. The method of claim 1 in which the matrix H is of the form (M M ... M I) where M is an r by m binary matrix and I is the identity matrix with r rows and r columns, and wherein the matrix M is repeated t times in H.

3. The matrix of claim 2 in which M is an odd weight matrix.

4. The method of claim 3 in which M is constructed as columns of distinct non-zero binary vectors having an odd number of ones but not including those vectors having single ones.

5. The method of claim 4 in which r is selected to be the smallest integer satisfying $m \leq 2^{r-1}-r$.

6. The method of claim 2 in which M is an even weight matrix.

7. The matrix of claim 6 in which M is constructed as columns of distinct non-zero vectors having an even number of ones.

8. The method of claim 7 in which r is selected to be the smallest integer satisfying $m \leq 2^{r-1}-1$.

9. The method of claim 1 in which the number of added check bits r needed to assure SEC-DED decoding capability is a minimum.

10. An electrical circuit for encoding input digital electrical signals representing binary data arranged in t blocks of m+1 bits each with each block also including at least one parity bit, said encoding occurring so as to produce output digital electrical check bit signals which satisfy linear constraint conditions determined by a parity check matrix H of the form H=(M M ... M I) where M is an r by m matrix, I is an r by r identity matrix and r check bits are added in addition to said at least one parity bit present in each block.

11. The electrical circuit of claim 10 in which the number of added check bits r needed to assure SEC-DED decoding capability is a minimum.

12. The electrical circuit of claim 10 in which M is an odd weight matrix.

13. The electrical circuit of claim 12 in which M is constructed as columns of distinct non-zero binary vectors having an odd number of ones but not including those vectors having single ones.

14. The electrical circuit of claim 13 in which r is selected to be the smallest integer satisfying $m \leq 2^{r-1}-r$.

15. The electrical circuit of claim 10 in which M is an even weight matrix.

16. The electrical circuit of claim 15 in which M is constructed as columns of distinct non-zero vectors having an even number of ones.

17. The electrical circuit of claim 16 in which r is selected to be the smallest integer satisfying $m \leq 2^{r-1}-1$.

18. An apparatus for error correction of binary data arranged in t blocks of m+1 bits each with a parity bit in each block and r additional check bits, said apparatus comprising:

parity checkers for each of said t blocks of binary data;

a syndrome generator based on a parity check matrix used to encode said binary data;

first circuit means for determining that a single error has occurred in said parity bits based upon an all-zero output from said syndrome generator and an indication from said parity checkers of one and only one parity bit error in said t blocks; and second circuit means for determining that a single non-parity error has occurred in one of said t blocks based upon a non-zero output from said syndrome generator and an indication from said parity checkers of one and only one parity error in said t blocks.

19. The apparatus of claim 18 in which said first circuit means comprises:

a first circuit for determining that an all-zero output from said syndrome generator has occurred; and a second circuit for determining that the output of one and only one of said t parity checkers have been selected.

20. The apparatus of claim 19 further including a circuit for switching the parity bit corresponding to the block of data bits indicated by said parity checkers.

21. The apparatus of claim 18 in which said second circuit means comprises:

a conjunctive circuit for indicating a non-zero output from said syndrome generator occurring at the same time as an indication from said parity checkers of one and only one parity error in said t blocks.

22. The apparatus of claim 21 further including circuit means for correcting a non-parity error.

23. The apparatus of claim 22 in which said means for correcting a non-parity error comprises:

a first circuit for comparing the output from said syndrome generator with columns from matrix M with r rows and m columns used to encode said data via a parity check matrix H of the form (M M ... M I) where there are t copies of M in H, so as to generate a signal indicative of which bit position in a block is in error; and a second circuit for switching the bit position in a block with a parity error, said position in said block being indicated by said first circuit.

24. The apparatus of claim 18 further including circuit means for indicating at least one form of uncorrectable error.

25. The apparatus of claim 18 further including circuit means for correcting errors in check bit positions.

26. The apparatus of claim 18 further including circuit means for indicating that no error has occurred.

27. A memory system comprising:

an array of addressable storage locations for binary data wherein said locations are capable of storing t blocks of data with m+1 bits in each block plus r check bits;

a digital encoding circuit for adding r check bits to (m+1)t bits of data prior to storage in one of said storage locations, wherein each block includes at least one parity bit; and a digital decoding circuit receiving mt+t+r bits of data from at least one of said storage locations, said decoding circuit being configured so as to be capable of indicating whether a single error has occurred in a specific one of said parity bits or in a specific non-parity bit, wherein said indication is made possible as a result of digital encoding for said r check bits as implemented by said digital encoding circuit and wherein said error indication does not depend on the entire group of mt+t+r bits.

28. The memory system of claim 27 in which said digital encoding circuit encodes utilizing a parity check matrix H of the form (M M . . . M I) where the matrix M is repeated t times in the parity check matrix H.

29. The memory system of claim 27 in which the number of check bits added is the smallest number of bits which is still capable of providing SEC-DED coding capability.

30. The memory system of claim 27 in which said digital decoding circuit comprises:

parity checkers for each of said t blocks of binary data;

a syndrome generator based on a parity check matrix used to encode said binary data;

first circuit means for determining that a single error has occurred in said parity bits based upon an all-zero output from said syndrome generator and an indication from said parity checkers of one and only one parity bit error in said t blocks; and second circuit means for determining that a single non-parity error has occurred in one of said t blocks based upon a non-zero output from said syndrome generator and an indication from said parity checkers of one and only one parity error in said t blocks.

* * * * *